(12) United States Patent
Wadhwa

(10) Patent No.: US 9,209,790 B1
(45) Date of Patent: Dec. 8, 2015

(54) LOW VOLTAGE, SELF-BIASED, HIGH-SPEED COMPARATOR

(71) Applicant: Sanjay K. Wadhwa, Noida (IN)

(72) Inventor: Sanjay K. Wadhwa, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/576,201

(22) Filed: Dec. 19, 2014

(51) Int. Cl.
*H03K 5/153* (2006.01)
*H03K 5/24* (2006.01)

(52) U.S. Cl.
CPC .................... *H03K 5/2472* (2013.01)

(58) Field of Classification Search
None
See application file for complete search history.

(56) References Cited

U.S. PATENT DOCUMENTS

| 4,410,813 | A | 10/1983 | Barker et al. |
| 6,020,768 | A | 2/2000 | Lim |
| 6,081,140 | A * | 6/2000 | King ........................ H03K 5/08 327/77 |
| 7,791,379 | B1 | 9/2010 | Bazes |
| 7,830,183 | B2 | 11/2010 | Seth et al. |
| 7,911,237 | B2 | 3/2011 | Maone |
| 8,456,196 | B2 | 6/2013 | Ochi |
| 2010/0066434 | A1 * | 3/2010 | Liao ........................ G05F 3/245 327/513 |

* cited by examiner

*Primary Examiner* — Long Nguyen
(74) *Attorney, Agent, or Firm* — Charles Bergere

(57) ABSTRACT

A low-voltage, self-biased, high-speed comparator receives and compares an analog input signal to a reference signal and generates a binary output signal whose value indicates whether the input signal is greater than or less than the reference signal. The comparator includes a current mirror, a voltage divider for establishing a midpoint voltage for generating a current reference for the current mirror, and a compensation circuit for stabilizing the comparator by preventing oscillations.

14 Claims, 4 Drawing Sheets

LOW VOLTAGE, SELF-BIASED, HIGH-SPEED COMPARATOR

BACKGROUND

The present invention relates generally to analog circuits, and more particularly, to a comparator for detecting whether the magnitude of an analog input signal is greater than or less than a preset threshold value.

A comparator is an analog circuit used to detect whether the magnitude of an analog input signal is greater than or is less than a preset threshold value. Comparators must be capable of operating under the conditions required of the application in which it is employed. For example, where the magnitude of an analog input signal changes rapidly, the comparator must quickly determine whether the magnitude of the analog input signal is greater than or is less than the predetermined threshold value. In many applications, it is desirable to provide comparators that operate at high speed at low voltage with low power consumption.

Conventional high-speed comparators rely on a current reference to provide a bias. For a comparator to operate at a higher speed, additional circuitry is typically employed to generate the increased current that produces increased speed. This results in a tradeoff between the speed of operation of a comparator and the additional area of integrated circuitry used to generate the increased current to achieve higher speed of operation.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
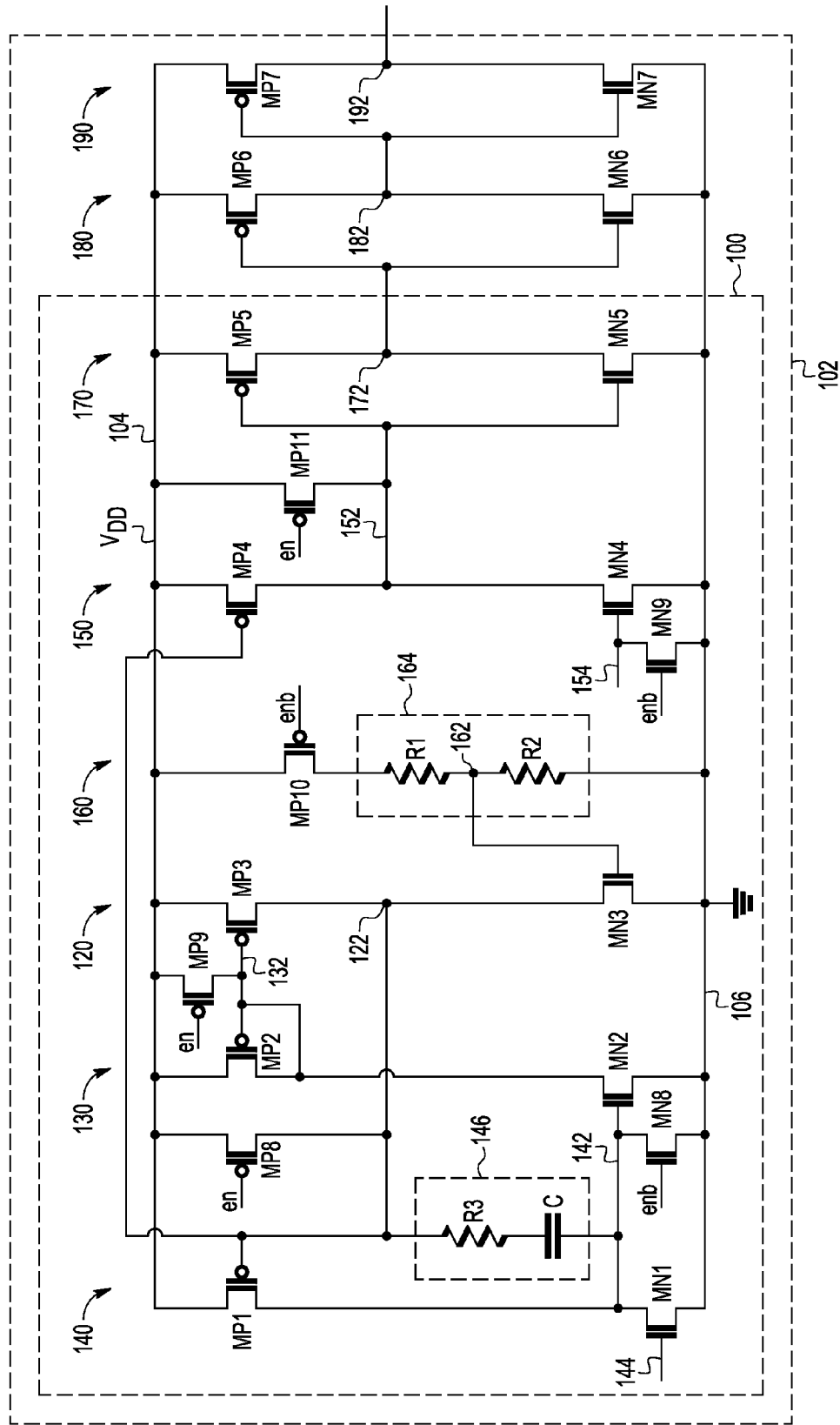
FIG. 1 is a schematic circuit diagram of a low-voltage, self-biased, high-speed comparator in accordance with an embodiment of the present invention.

Detailed illustrative embodiments of the present invention are disclosed herein. However, specific structural and functional details disclosed herein are representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

In one embodiment, the present invention provides a comparator for comparing two signals. A voltage divider develops a midpoint voltage between a voltage on a power rail and a voltage on a low-voltage rail. A current mirror, including a first transistor stack connected to a second transistor stack, establishes a first current in the first transistor stack and establishes a second current, proportional to the first current, in the second transistor stack. The first current is determined by the midpoint voltage and develops a first bias signal at a first bias node. The second current develops a second bias signal at a second bias node. A compensation circuit that prevents oscillations in the comparator is coupled between the first and second bias nodes. A first inverter including a third transistor stack receives a reference signal and establishes a third current through the third transistor stack. The third current is determined partially by the reference signal and partially by the first and second bias signals. A second inverter including a fourth transistor stack receives an input signal for comparison to the reference signal and establishes a fourth current through the fourth transistor stack. The fourth current is determined partially by the input signal and partially by the first and second bias signals. The fourth transistor stack generates an output signal, the magnitude of which is an indication whether the input signal is greater than, or less than, the reference signal.

In another embodiment, the present invention provides a low voltage headroom comparator for comparing two signals. The comparator includes first and second transistors having conduction paths in series between a power supply rail and a low voltage rail. A bias node is formed at a connection of drains of the first and second transistors. A gate of the second transistor is coupled to a voltage reference midpoint between the power supply rail and the low voltage rail. The comparator also includes third and fourth transistors having conduction paths in series between the power supply rail and the low voltage rail, the first and third transistors being configured as a current mirror. The comparator also includes fifth and sixth transistors having conduction paths in series between the power supply rail and the low voltage rail. A gate of the sixth transistor is configured to receive a predetermined reference signal, and a gate of the fourth transistor is coupled to a drain of the sixth transistor. The comparator also includes seventh and eight transistors having conduction paths in series between the power supply rail and the low voltage rail. The comparator provides an output at a connection of drains of the seventh and eighth transistors. A gate of the eighth transistor is configured to receive a magnitude varying input signal. A gate of each of the fifth and seventh transistors is coupled to the bias node, and a compensation circuit is coupled between the gate of the fourth transistor and the bias node.

In yet another embodiment, the present invention provides a low voltage, self-biased, high speed comparator for comparing two signals. The comparator includes a first transistor stack including first and second transistors having conduction paths in series between a power supply rail and a low voltage rail. A bias node is formed at a connection of drains of the first and second transistors. A gate of the second transistor is coupled to a voltage reference midpoint between the power supply rail and the low voltage rail. The first transistor stack has no more than two series coupled transistor conduction paths between the power rail and the low voltage rail. The comparator also includes a second transistor stack including third and fourth transistors having conduction paths in series between the power supply rail and the low voltage rail, the first and third transistors being configured as a current mirror. The second transistor stack has no more than two series coupled transistor conduction paths between the power rail and the low voltage rail. The comparator includes a compensation circuit coupled between a gate of the fourth transistor and the bias node. The comparator also includes a third transistor stack including fifth and sixth transistors having conduction paths in series between the power supply rail and the low voltage rail. A gate of the sixth transistor is configured to receive a predetermined reference signal. A gate of the fourth transistor is coupled to a drain of the sixth transistor. The third transistor stack has no more than two series coupled transistor conduction paths between the power rail and the low voltage rail. The comparator also includes a fourth transistor stack including seventh and eight transistors having conduction paths in series between the power supply rail and the low voltage rail. The comparator provides an output at a connection of drains of the seventh and eighth transistors. A gate of the eighth transistor is configured to receive a magnitude varying input signal, and a gate of each of the fifth and seventh transistors is coupled to the bias node. The fourth transistor stack has no more than two series coupled conduction paths between the power rail and the low voltage rail.

Referring now to FIG. 1, a schematic circuit diagram of a low-voltage, self-biased, high-speed comparator 100 according to an embodiment of the present invention is shown. The comparator 100 is typically fabricated as a portion of an integrated circuit 102. An integrated circuit may have one or more instantiations of the comparator 100. For example, an analog-to-digital converter would have multiple instantiations of the comparator 100 to slice an analog signal into a respective number of predetermined levels. The comparator 100 receives and compares an analog input signal 154 to a reference signal 144 and generates a binary output signal 172, whose value indicates whether the input signal 154 is greater than or less than the reference signal 144.

The comparator 100 is a low-power, low-voltage, self-biased high-speed comparator. The comparator 100 includes several transistor stacks coupled between the power supply rail 104 having a voltage $V_{DD}$ impressed thereon, and a low-voltage rail 106 having a low voltage, ostensibly ground, impressed thereon. In some embodiments the comparator 100 is self-biasing in that it is biased by an internal voltage divider circuit and the reference signal 144. An external current source is not required.

To eliminate unnecessary consumption of leakage power when operation of the comparator is not required, an enable signal is employed along with its complement, the enable bar signal. The enable signal is illustrated in the figures as "en" and its complement the enable bar signal is illustrated as "enb". When the enable signal is a logic low, and concomitantly the enable bar signal is a logic high, n-type transistors having a gate coupled to the enable signal will be in the off state (drain-to-source conductive path not conducting) whereas n-type transistors with a gate coupled to the enable bar signal will be in the on state (drain-to-source conductive path conducting). The opposite is true for p-type transistors.

A first transistor stack 120 includes a p-type metal-oxide-semiconductor (PMOS) transistor MP3 and an n-type metal-oxide-semiconductor (NMOS) transistor MN3. The source of the transistor MP3 is coupled to the power rail 104, and the drain is coupled to the drain of the transistor MN3 to form a bias node 122. The source of the transistor MN3 is coupled to the low-voltage rail 106. The drain-to-source conduction paths of the transistors MP3 and MN3 are in series between the power rail 104 and the low-voltage rail 106.

A second transistor stack 130 includes the PMOS transistor MP2 and the NMOS transistor MN2. The source of the transistor MP2 is coupled to the power rail 104, and the drain is coupled to the drain of the transistor MN2. The source of the transistor MN2 is coupled to the low-voltage rail 106. The drain-to-source conduction paths of the transistors MP2 and MN2 are in series. The transistors MP3 and MP2 are configured as a current mirror with the gates of the transistors MP3 and MP2 coupled at node 132 to the drain of the transistor MP2.

A third transistor stack 140 includes a PMOS transistor MP1 and an NMOS transistor MN1. The source of the transistor MP1 is coupled to the power rail 104, and the drain is coupled to the drain of transistor MN1. The source of the transistor MN1 is coupled to the low-voltage rail 106. The drain-to-source conduction paths of the transistors MP1 and MN1 are in series. The gate of the transistor MN2 is coupled to the drain of the transistor MN1 at bias node 142, and the gate of the transistor MP1 is coupled to bias node 122. The gate 144 of the transistor MN1 is configured to receive the predetermined reference signal 144 to which the analog input signal 154 is compared.

Compensation circuit 146, including the series-coupled resistor R3 and the capacitor C1, is coupled between the bias node 142 and the bias node 122. The magnitude values of the resistor R3 and the capacitor C1 are selected to provide stability by preventing feedback oscillation. The values of the resistor R3 and the capacitor C1 are chosen in such a way so as to obtain a phase margin sufficient to assure positive feedback does not occur, thereby precluding oscillations in the comparator 100. For a typical low-voltage application, typical values for the resistor R3 and the capacitor C1 are 7.62 K ohms and 3.76 picofarads, respectively.

A fourth transistor stack 150 includes a PMOS transistor MP4 and an NMOS transistor MN4. The source of the transistor MP4 is coupled to the power rail 104, and the drain is coupled to the node 152 and to the drain of transistor MN4. The source of the transistor MN4 is coupled to the low-voltage rail 106. The drain-to-source conduction paths of the transistors MP4 and MN4 are in series. The gate of the transistor MP4 is coupled to the bias node 122. The gate 154 of the transistor MN4 is configured to receive the magnitude-varying analog input signal to be compared to the predetermined reference signal received on the gate 144. The voltage developed at the node 152 is a signal that indicates whether the magnitude of the input signal 154 is larger than, or smaller than, the magnitude of the predetermined reference signal 144. In some applications, the signal generated at the node 152 would suffice as the comparator 100 output signal for subsequent processing.

Comparator 100 includes a voltage divider branch 160 coupled between the power rail 104 and the low-voltage rail 106. In one embodiment, the voltage divider branch 160 includes a PMOS transistor MP10 in series with a voltage divider circuit 164. The transistor MP10 functions as an on-off switch selectively controlling the activation and deactivation of the voltage divider branch 160. The voltage divider branch 160 is (i) coupled to the power rail 104 when the transistor MP10 is switched to the on state by the enable bar signal being logic low and (ii) isolated from the power rail 104 when the transistor MP10 is switched to the off sate by the enable bar signal being logic high. The voltage divider circuit 164 is a pair of equal-resistance resistors, the resistor R1 and the resistor R2, that divide the voltage between the power rail 104 and the low-voltage rail 106 to generate a midpoint voltage at the divided voltage node 162.

The channel width of the transistor MP10 is fabricated to be relatively wide so as not to have a significant impact on the voltage developed at the divided voltage note 162. Typical resistances for each of the resistors R1 and R2 is 12.64 K ohms. The combined resistance of the resistors R1 and R2 is large in comparison to the impedance of the transistor MP10 in the on state. As is known in the art, each of the resistors R1 and R2 can be fabricated as multiple resistances configured such that the resistance of the resistor R1 equals the resistance of the resistor R2.

Voltage divider circuit 164 develops a mid-point voltage between the voltage on the power rail 104 and the voltage on the low voltage rail 106. The mid-point voltage developed at the divided voltage node 162 is $V_{DD}/2$. The divided voltage node 162 is coupled to the gate of the transistor MN3.

The inverter 170 includes a PMOS transistor MP5 and an NMOS transistor MN5. The source of the transistor MP5 is coupled to the power rail 104, and the drain is coupled to the drain of the transistor MN5 forming the node 172. The source of the transistor MN5 is coupled to the low-voltage rail 106. The drain-to-source conduction paths of the transistors MP5 and MN5 are in series. The gates of the transistors MP5 and MN5 are coupled to the node 152. The inverter 170 is coupled to receive as an input signal the signal developed at the node 152 and to provide an output at the node 172 that is a binary-valued inverse of the input signal, extending between the power supply rail 104 and the low-voltage rail 106.

The inverter 180 includes a PMOS transistor MP6 and an NMOS transistor MN6. The source of the transistor MP6 is coupled to the power rail 104, and the drain is coupled to the drain of the transistor MN6 forming the node 182. The source of the transistor MN6 is coupled to the low-voltage rail 106. The drain-to-source conduction paths of the transistors MP6 and MN6 are in series. The gates of the transistors MP6 and MN6 are coupled to the node 172. The inverter 180 is coupled to receive as an input signal the binary signal from node 172 of the previous inverter 170 and to provide an output at the node 182 that is the inverse of the input signal 172.

The inverter 190 includes a PMOS transistor MP7 and an NMOS transistor MN7. The source of the transistor MP7 is coupled to the power rail 104, and the drain is coupled to the drain of the transistor MN7 forming the node 192. The source of the transistor MN7 is coupled to the low-voltage rail 106. The drain-to-source conduction paths of the transistors MP7 and MN7 are in series. The gates of the transistors MP7 and MN7 are coupled to the node 182. The inverter 190 is coupled to receive as an input signal the binary signal from node 182 of the previous inverter 180 and to provide an output at node 192 that is the inverse of the input signal 182.

The number of cascaded inverter stages (170, 180, 190 in FIG. 1), if any, will determine whether the output of the last inverter stage (190 in FIG. 1) is an inverted or a non-inverted version of the signal at node 152. The output from the last stage of an even number of cascaded inverters will produce an output that is a non-inverted version of the signal at node 152, whereas an odd number of cascaded inverters will produce an output that is an inverted version of the signal at node 152.

While only three inverters 170, 180, and 190 have been described, embodiments of the invention are not limited thereto. Additional gain may be desirable in either magnitude of the output signal, such as a voltage, or in drive current. One skilled in the art will understand that there are many ways of implementing higher gain or drive strength.

The PMOS transistors MP8, MP9, MP10, and MP11 and the NMOS transistors MN8 and MN9 function as switches and transition simultaneously to activate the comparator 100 and to maintain the comparator 100 in an activated state when operation of the comparator 100 is required and to deactivate the comparator 100 and to maintain the comparator 100 in a deactivated state when the operation of the comparator 100 is not required.

The transistor MP8 selectively (i) couples the bias node 122 to the power rail 104 to cease operation of the comparator 100 and to maintain the comparator 100 in a deactivated state when the enable signal en is a logic low and (ii) disconnects the bias node 122 from the power rail 104 to initiate and maintain operation of the comparator 100 when the enable signal en is a logic high.

The PMOS transistors MP9 and MP11 provide the same function as the transistor MP8 to initiate operation of or cease operation of the comparator 100. The transistor MP9 selectively (i) couples and (ii) disconnects the node 132 and the power rail 104, whereas the transistor MP11 selectively (i) couples and (ii) disconnects the node 152 and the power rail 104.

The transistor MP10 selectively (i) couples the voltage divider circuit 164 to the power rail 104 to initiate and maintain operation of the comparator 100 when the enable bar signal is a logic low and (ii) disconnects the voltage divider circuit 164 from the power rail 104 to cease operation of the comparator 100 and to maintain the comparator 100 in a deactivated state when the enable bar signal is a logic high.

The transistor MN8 selectively (i) connects the bias node 142 to the low-voltage rail 106 to cease operation of the comparator 100 and to maintain the comparator 100 in a deactivated state when the enable bar signal is a logic high and (ii) disconnects bias node 142 from the low-voltage rail 106 to initiate and maintain operation of the comparator 100 when the enable bar signal is a logic low.

When operation of the comparator 100 is required, the transistors MP8, MP9, MP11, MN8 and MN9 transition to an off state, and the transistor MP10 transitions to an on state due to the enable or enable bar signal on the respective gate of each of the transistors. The voltage divider circuit 164 is activated and generates a voltage at the divided voltage node 162 that is $V_{DD}/2$ volts which is applied to the gate of the transistor MN3. The transistor MN3 conducts a current determined by the gate voltage of transistor MN3. Since the conduction paths of the transistors MP3 and MN3 are in series, the same magnitude current is conducted by the transistor MP3 as is conducted by the transistor MN3, and a voltage is developed at the bias node 122. The bias voltage developed at the node 122 is applied to the gates of the transistors MP1 and MP4.

In one embodiment, the transistors MP2 and MP3 form a current mirror having a ratio of 1:1 due to the width-to-length ratio of the respective transistor channels being the same. As such, the current through the drain-to-source conduction paths of the transistors MP2 and MP3 are identical. Since the conduction paths of the transistors MP2 and MN2 are in series, the same magnitude current is conducted by the transistor MN2 as is conducted by the transistor MP2. Furthermore, since the transistors MN3 and MN2 are the same size, that is the width-to-length ratio of the respective transistor channels are the same, the gate voltage developed on the gate of the transistor MN2 is the same as the voltage applied to the gate of the transistor MN3, i.e., $V_{DD}/2$. For a typical low-voltage application where $V_{DD}$ is 1.2 volts, the voltage applied to the gate of the transistor MN3 and hence the voltage developed at the gate of the transistor MN2 is 600 millivolts. In other embodiments, the transistor MP3 could be sized differently from the transistor MP2, and transistor MN3 could be sized differently from the transistor MN2, if the ratio of transistor sizes is accounted for in the comparator 100 circuit. For example, when the channel width-to-length ratio of the transistor MP3 is twice as large as the channel width-to-length ratio of the transistor MP2, the transistor MP3 will carry twice as much current as the transistor MP2. In order to maintain the gate voltage of the transistors MN2 and MN3 the same, the channel width-to-length ratio of the transistor MN3 would be sized to be twice the channel width-to-length ratio of the transistor MN2.

The third transistor stack 140 and the fourth transistor stack 150 are inverters. In one embodiment, the transistors MP1 and MP4 are sized to have the same channel width and length, in which case they also have the same channel width-to-length ratio. In addition, the transistors MN1 and MN4, in another embodiment, are sized to have the same channel width and length, in which case they also have the same channel width-to-length ratio. In other embodiments, the transistor MN4 could be sized differently from the transistor MN1, and the transistor MP4 could be sized differently from the transistor MP1, if the ratio of sizes is accounted for in the comparator 100 circuit. For example, the size of the transistors MN4 and MP4 could be n times the size of the transistors MN1 and MP1, where n is a positive number that is not required to be an integer. In this manner, transistors in the fourth transistor stack 150 are sized larger than the corresponding transistors in the third transistor stack 140 and are capable of providing a larger drive current. The current sourced by a transistor is, in part, due to the transistor channel width-to-length ratio. A transistor with a larger channel width-to-length ratio can source more current than transistors with a smaller channel width-to-length ratio. One skilled in the art will understand that multiple, smaller CMOS transistors, each having a channel width-to-length ratio, operating with their channels in parallel, are equivalent to one larger transistor with a channel width-to-length ratio that is the sum of the channel width-to-length ratios of the individual smaller transistors.

For an exemplary low-voltage application, a predetermined reference signal 144 of 700 millivolts is applied to the gate of the transistor MN1 for comparison to an analog input signal 154, which can range from zero to $V_{DD}$ volts, applied to the gate of the transistor MN4. A voltage of 700 millivolts was selected as the predetermined reference signal; however, the voltage representing the predetermined reference signal could be slightly greater than or slightly less than 700 millivolts, and the comparator 100 will still operate. In the CMOS technology in which the comparator 100 has been designed, a voltage of 700 millivolts along with a suitable channel width-to-length ratio of the transistors MN1 and MP1, provides sufficient current through the transistors MP1 and MN1 in transistor stack 140, as well as through the transistors MP4 and MN4 in transistor stack 150, when the input signal 154 magnitude is proximate the magnitude of the predetermined reference 144 across all process, temperature, and operating conditions. Since the transistors MP4 and MP1 are the same size, and the transistors MN4 and MN1 are the same size, the voltage at node 152 will be same as the voltage of the bias node 142 (i.e., $V_{DD}/2$) when the input signal 154 is approximately equal to the predetermined reference signal 144. When the input signal 154 is slightly smaller than the predetermined reference signal 144, the voltage at node 152 will be larger than $V_{DD}/2$. Conversely, when the input signal 154 is slightly larger than the predetermined reference signal 144, the voltage at the node 152 will be smaller than $V_{DD}/2$. One skilled in the art of comparator design would know how to scale the analog input signal to result in the desired comparison magnitude to be at the voltage level of the predetermined reference signal 144.

The transistor MN1 carries a current the magnitude of which, in part, is determined by its gate voltage. The gate of the transistor MN1 receives the predetermined reference signal 144. In a steady-state condition, the same current passes through the transistors MP1 and MN1 since their conduction paths are in series. The voltage developed at the bias node 122 adjusts the gate voltage of the transistor MP1 such transistor MP1 supports the magnitude of current required by the transistor MN1 while the gate of the transistor MN2 is maintained at the same voltage as is applied to the gate of the transistor MN3, i.e., $V_{DD}/2$. In transient operating conditions when the input signal 154 changes, the currents in the transistor stacks 120, 130, and 140 remain relatively constant and the current in the transistor stack 150 changes depending upon the changes in input signal 154.

The current in the transistor stack 150 can change rapidly during a transient condition and hence the comparator 100 has a high bandwidth. Furthermore, large currents can be accommodated by appropriately sizing the transistors that comprise the comparator 100.

Although the comparator 100 was designed for a particular technology node and semiconductor substrate, the comparator scales easily to other technology nodes and can be fabricated in any suitable semiconductor substrate.

The enable and enable bar signals contribute to reducing leakage power consumption by deactivating the comparator 100 when its output is not required and activating the comparator 100 when its output is needed. Comparator 100 is deactivated when the transistors MP8, MP9, MP11, MN8, and MN9 transition to an on state, and the transistor MP10 transitions to an off state due to the enable or enable bar signal on the respective gate of each transistor. When the comparator 100 is deactivated, in order to stop the leakage current through the transistor MP11, the gate 154 of the transistor MN4 is pulled to the voltage of the low voltage rail 106 by the transistor MN9.

While the transistors MP8, MP9, MP10, MP11, MN8, and MN9 contribute to power savings as the above implementation indicates, they are not considered necessary for the comparator 100 to operate. In embodiments of the comparator 100 that do not deactivate (power down) the comparator 100 when its output 172 is not needed and then activate (power up) the comparator 100 when its output 172 is needed, or in embodiments that utilize a different technique to power up and down the comparator 100, such as multiple power domains where an individual power domain can be powered when needed and not powered when not needed, the transistors MP8, MP9, MP10, MP11, MN8 and MN9 would not be present.

Note that the branch circuit of each transistor stack (120, 130, 140, 150, and 170) of the comparator 100 is no more than two transistors in height, that is no more than two series-connected transistor conduction paths coupled between the power rail 104 and the low-voltage rail 106. Dynamic power in switching circuits is a function of the square of the power supply voltage, i.e., $V_{DD}$. Having transistor stacks that are no more than two transistors high permits the voltage applied to the power rail 104 to be the minimum voltage at which the stack of two transistors will operate, contributing to reduced power consumption. Further, this arrangement provides higher bandwidth or speed of operation. The architecture of the comparator 100 enables the transistor stacks to be implemented as two series conduction paths between the power rail 104 and the low-voltage rail 106. Using feedback, the voltage at the node 152 is substantially equal to the switching threshold of the inverter 170 when the magnitude of the input signal 154 is substantially equal to the magnitude of the predetermined reference signal 144.

Figure 2:
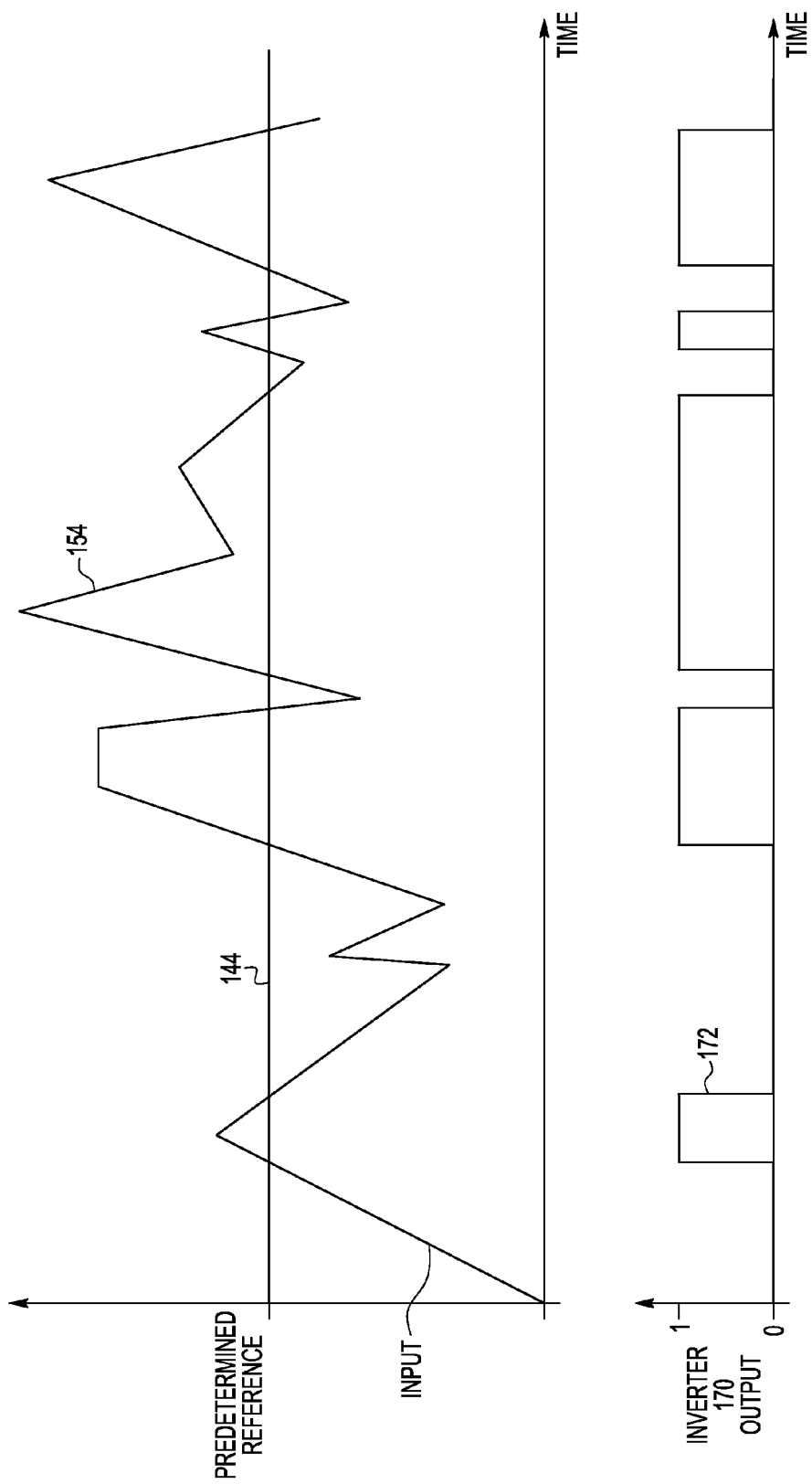
FIG. 2 is a graph of (i) an analog input signal overlying a predetermined reference signal (ii) and an output of the comparator.

FIG. 2 is a graphical representation of an exemplary analog input signal 154 received at an input of the comparator 100, overlying a predetermined reference signal 144. FIG. 2 also presents a graphical representation of the corresponding generated binary output signal 172, whose value is logic 1 to indicate when the magnitude of the input signal 154 is greater than the magnitude of the predetermined reference signal 144, and whose value is logic 0 to indicate when the magnitude of the input signal 154 is less than the magnitude of the predetermined reference signal 144. As the magnitude of the input signal 154 increases from zero magnitude and approaches the magnitude of the predetermined reference signal 144, the current in the transistors MP4 and MN4 increases. Initially, the node 152 is at a higher voltage than the switching threshold of the inverter 170, typically $V_{DD}/2$, which causes the output 172 to be in a logic low state. When the magnitude of the input signal 154 slightly exceeds the magnitude of the predetermined reference signal 144, the node 152 transitions to be less than the switching threshold of the inverter 170, and the output 172 transitions rapidly to a logic high state indicating that the magnitude of the input signal 154 is larger than the magnitude of the predetermined reference signal 144. When the magnitude of the input signal 154 reverses direction and approaches the magnitude of the predetermined reference signal 144, the node 152 remains less than the switching threshold of the inverter 170, and the output 172 remains a logic high as long as the magnitude of the input signal 154 is not smaller than the magnitude of the predetermined reference signal 144.

When the magnitude of the input signal 154 becomes slightly smaller than the magnitude of the predetermined reference signal 144, the node 152 transitions to be greater than the switching threshold of the inverter 170, and the output 172 transitions rapidly to a logic low state. Concomitantly, the output of each of the subsequent cascaded inverters also transitions to the respective, opposite logic state. Depending on the application, either the voltage developed at the node 152 or the output of the inverter 170 at the node 172 can be taken as the output of the comparator 100. Both the output 152 and the output 172 are available for further processing if needed.

Although FIG. 1 depicts a voltage divider circuit 164 fabricated as two equal resistors, the resistor R1 and the resistor R2, to generate a voltage reference of $V_{DD}/2$ at the divided voltage node 162, one skilled in the art will understand that there are many different ways of implementing a voltage divider circuit.

Figures 3, 4:
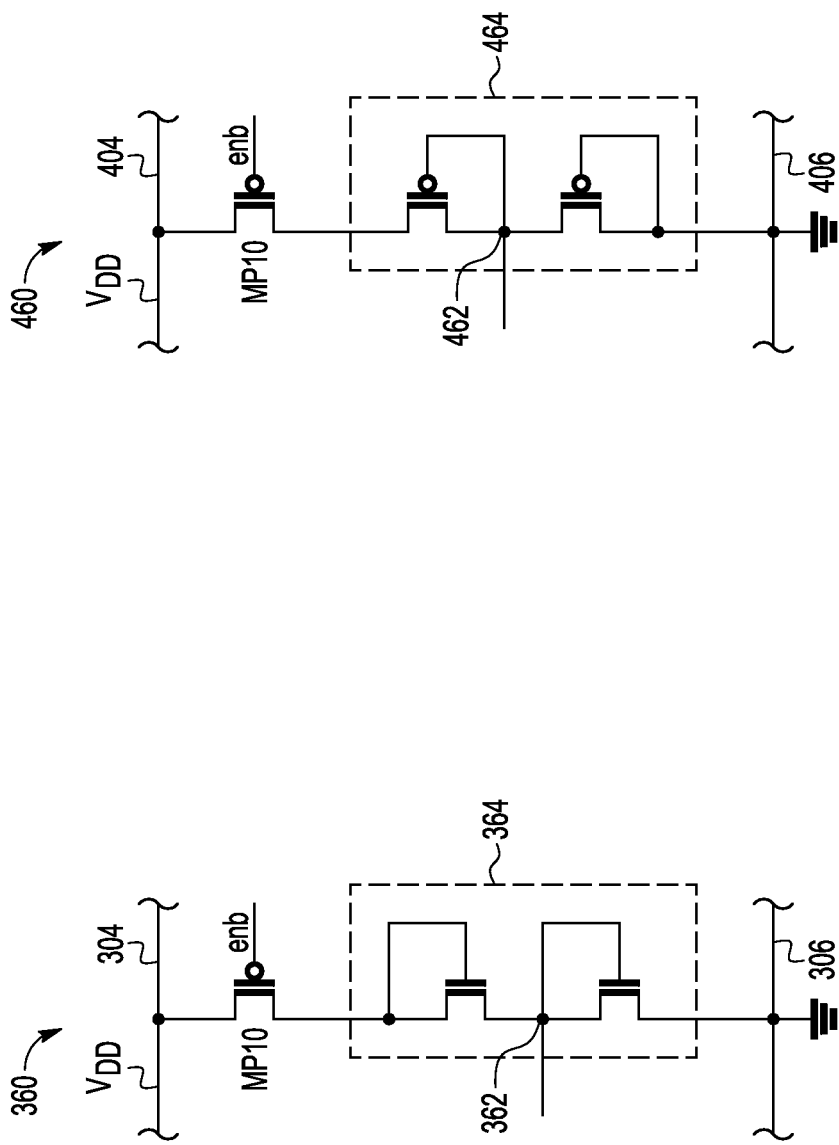
FIG. 3 is a partial schematic circuit diagram of an NMOS transistor-based voltage divider circuit that can be used to provide a divided voltage reference in an alternative embodiment of the comparator of FIG. 1.
FIG. 4 is a partial schematic circuit diagram of a PMOS transistor-based voltage divider circuit that can be used to provide a divided voltage reference in an alternative embodiment of the comparator of FIG. 1.

FIG. 3 depicts a voltage divider branch 360 including a voltage divider circuit 364 that employs two identical NMOS transistors in diode configuration operating in the saturation region to provide a voltage at the divided voltage node 362 of $V_{DD}/2$. An alternative embodiment of the invention results when the voltage divider branch 360 replaces the voltage divider branch 160 in FIG. 1.

Similarly, FIG. 4 depicts a voltage divider branch 460 including a voltage divider circuit 464 that employs two identical PMOS transistors in diode configuration operating in the saturation region to provide a voltage at the divided voltage node 462 of $V_{DD}/2$. Yet another alternative embodiment of the invention results when the voltage divider branch 460 replaces the voltage divider branch 160 in FIG. 1.

Figure 5:
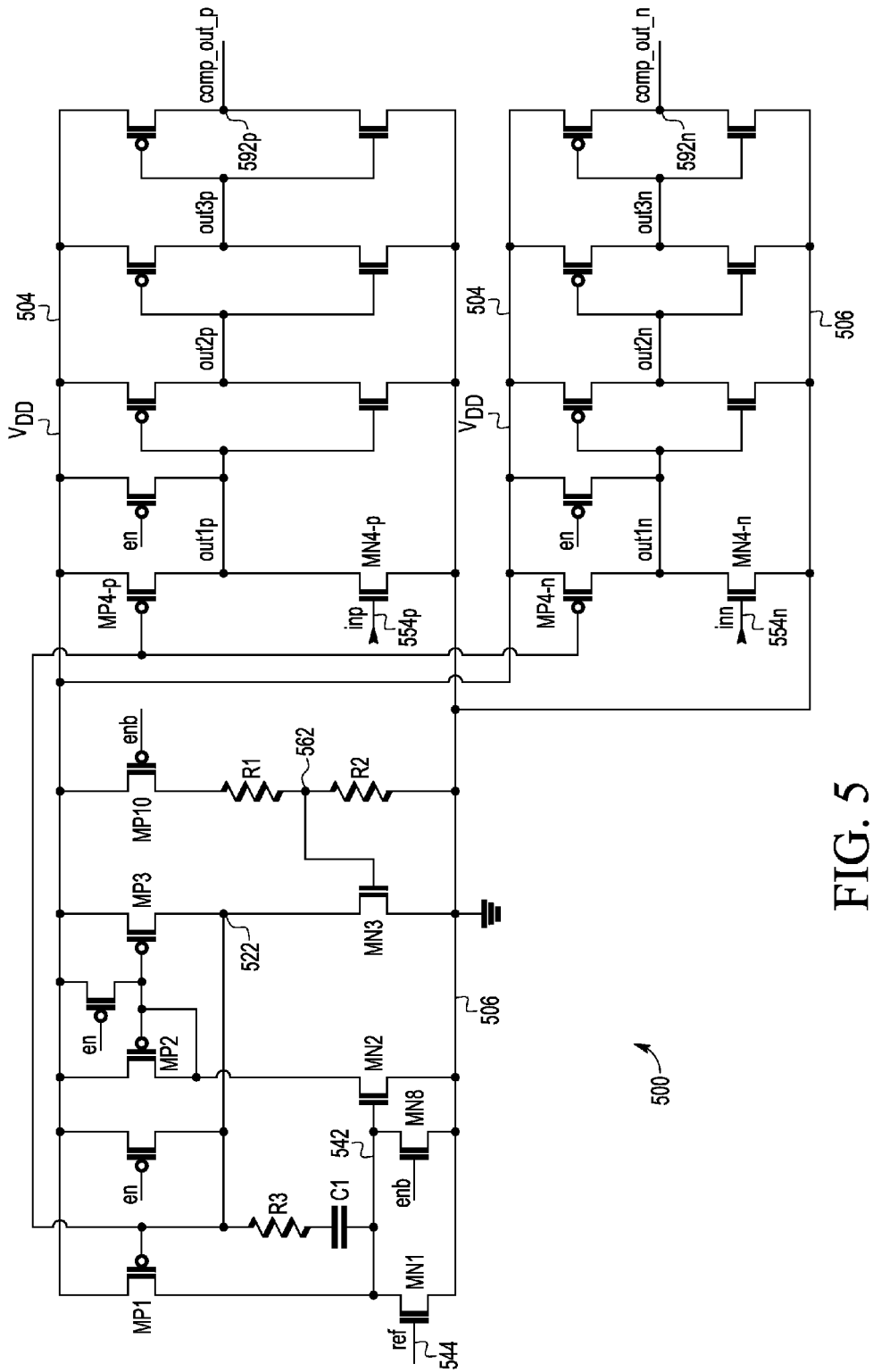
FIG. 5 is a schematic circuit diagram of an alternative embodiment fully differential, low-voltage, self-biased, high-speed comparator in accordance with the present invention.

FIG. 5 is a circuit diagram of a differential, low-voltage, self-biased, high-speed comparator 500 according to an alternative embodiment of the invention. The differential comparator 500 is a differential version of the single-ended comparator 100 described above with respect to FIG. 1. One skilled in the art, after understanding the description and operation of the single-ended comparator 100, would also understand the differential version of the comparator 500. The comparator 500 receives and compares the analog differential input signal inp, inn to the reference signal ref and generates the complementary binary output signal comp_out_p, comp_out_n, whose values indicate whether the input signal inp, inn is greater than or less than the reference signal 544.

While embodiments of the invention have been described as having NMOS and PMOS transistor switches to selectively activate or deactivate various circuits of the comparator, and in the aggregate the entire comparator, the invention is not limited thereto. One skilled in the art will understand there are many different ways of implementing switches to provide the equivalent result of selectively activating or deactivating various circuits of the comparator, and in the aggregate the entire comparator. For example, the function of each PMOS switch could be achieved by using an NMOS switch or switches appropriately positioned to couple one of the power rail and the low-voltage rail to the comparator to activate the comparator or to decouple one of the power rail and the low-voltage rail from the comparator to deactivate the comparator, and vice versa.

While embodiments of the invention have been described in which (i) the transistors MP2 and MP3 are the same size, (ii) the transistors MN2 and MN3 are the same size, (iii) the transistors MP1 and MP4 are the same size, and (iv) the transistors MN1 and MN4 are the same size, the invention is not limited thereto.

In an embodiment where the width-to-length ratio of the transistor MP3 is made twice the width-to-length ratio of the transistor MP2, then the transistor MP3 will carry twice as much current as the transistor MP2. In order to maintain the gate voltage 142 of the transistor MN2 the same as the gate voltage 162 of transistor MN3, the width-to-length ratio of the transistor MN3 would also be made twice the width-to-length ratio of the transistor MN2.

Also for purposes of this description, the terms "couple," "couples," "coupling," "coupled," "connect," "connects," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel or series to get desired electrical characteristics from the combination. Further, the illustrated transistors may be composite transistors.

Unless explicitly shown otherwise, the source of a transistor is connected to its substrate.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A comparator, comprising:
   a voltage divider that develops a midpoint voltage between a voltage on a power rail and a voltage on a low-voltage rail;
   a current mirror comprising a first transistor stack connected to a second transistor stack, wherein:
      the current mirror establishes a first current in the first transistor stack, the first current determined by the midpoint voltage, the first current developing a first bias signal at a first bias node; and
      the current mirror establishes in the second transistor stack a second current proportional to the first current, wherein the second current develops a second bias signal at a second bias node;
   a compensation circuit coupled between the first and second bias nodes that prevents oscillations in the comparator;
   a first inverter comprising a third transistor stack, wherein the first inverter receives a reference signal and establishes a third current through the third transistor stack, the third current being determined partially by the reference signal and partially by the first and second bias signals; and
   a second inverter comprising a fourth transistor stack, wherein the second inverter receives an input signal for comparison to the reference signal and establishes a fourth current through the fourth transistor stack, the fourth current being determined partially by the input signal and partially by the first and second bias signals, the fourth transistor stack generates an output signal the magnitude of which is an indication whether the input signal is greater than or less than the reference signal.

2. The comparator of claim 1, wherein the fourth transistor stack is no more than two transistors in height between the power rail and the low-voltage rail.

3. The comparator of claim 2, wherein each of the first, second, and third transistor stacks is no more than two transistors in height between the power rail and the low-voltage rail.

4. The comparator of claim 1, further comprising:
N additional inverter stages, where N is an integer greater than or equal to one, the first one of the N additional inverter stages receiving the output of the fourth transistor stack as an input and providing an output that is a binary-valued inverse of the input; and
each subsequent one of the N−1 additional inverter stages receiving the output from a preceding inverter stage as an input and providing an output that is a binary-valued inverse of the input.

5. The comparator of claim 1, wherein transistors in the fourth transistor stack are sized larger than corresponding transistors in the third transistor stack.

6. The comparator of claim 1, wherein the comparator is fabricated as part of an integrated circuit.

7. The comparator of claim 1, further comprising a switch (MP10) connected in series with the voltage divider between the power rail and the low-voltage rail to power down the voltage divider when the comparator is turned off.

8. The comparator of claim 1, wherein the compensation circuit comprises a resistor and a capacitor connected in series.

9. The comparator of claim 1, further comprising:
a first switch coupled between the first bias node and the power rail;
a second switch coupled between the gates of the first and third transistors and the power rail;
a third switch coupled between the output of the fourth transistor stack and the power rail;
a fourth switch coupled between the second bias node and the low-voltage rail; and
a fifth switch coupled between the input signal and the low-voltage rail, wherein the first, second, third, and fourth switches are controlled to control whether the comparator is turned on or off.

10. The comparator of claim 1, wherein the third transistor stack comprises a transistor configured to receive the predetermined reference signal on a gate terminal, the transistor having a channel width-to-length ratio, the third current also partially determined by the width-to-length ratio of the transistor.

11. The comparator of claim 1, wherein the fourth transistor stack comprises a transistor configured to receive the input signal on a gate terminal, the transistor having a channel width-to-length ratio, the fourth current also partially determined by the width-to-length ratio of the transistor.

12. The comparator of claim 1, wherein:
sizes of transistors in the first transistor stack are equivalent to sizes of corresponding transistors in the second transistor stack; and
sizes of transistors in the third transistor stack are equivalent to sizes of corresponding transistors in the fourth transistor stack.

13. A low voltage headroom comparator, comprising:
first and second transistors having conduction paths in series between a power supply rail and a low voltage rail, a bias node formed at a connection of drains of the first and second transistors, a gate of the second transistor coupled to a voltage reference midpoint between the power supply rail and the low voltage rail;
third and fourth transistors having conduction paths in series between the power supply rail and the low voltage rail, the first and third transistors being configured as a current mirror;
fifth and sixth transistors having conduction paths in series between the power supply rail and the low voltage rail, a gate of the sixth transistor configured to receive a predetermined reference signal, a gate of the fourth transistor coupled to a drain of the sixth transistor;
seventh and eight transistors having conduction paths in series between the power supply rail and the low voltage rail, the comparator providing an output at a connection of drains of the seventh and eighth transistors, a gate of the eighth transistor configured to receive a magnitude varying input signal, a gate of the fifth and seventh transistors coupled to the bias node; and
a compensation circuit coupled between the gate of the fourth transistor and the bias node.

14. A low voltage, self-biased, high speed comparator, comprising:
a first transistor stack including first and second transistors having conduction paths in series between a power supply rail and a low voltage rail, a bias node formed at a connection of drains of the first and second transistors, a gate of the second transistor coupled to a voltage reference midpoint between the power supply rail and the low voltage rail, the first transistor stack having no more than two transistor conduction paths between the power rail and the low voltage rail;
a second transistor stack including third and fourth transistors having conduction paths in series between the power supply rail and the low voltage rail, the first and third transistors being configured as a current mirror, the second transistor stack having no more than two transistor conduction paths between the power rail and the low voltage rail;
a compensation circuit coupled between a gate of the fourth transistor and the bias node;
a third transistor stack including fifth and sixth transistors having conduction paths in series between the power supply rail and the low voltage rail, a gate of the sixth transistor configured to receive a predetermined reference signal, a gate of the fourth transistor coupled to a drain of the sixth transistor, the third transistor stack having no more than two transistor conduction paths between the power rail and the low voltage rail; and
a fourth transistor stack including seventh and eight transistors having conduction paths in series between the power supply rail and the low voltage rail, the comparator providing an output at a connection of drains of the seventh and eighth transistors, a gate of the eighth transistor configured to receive a magnitude varying input signal, a gate of the fifth and seventh transistors coupled to the bias node, the fourth transistor stack having no more than two series coupled conduction paths between the power rail and the low voltage rail.

\* \* \* \* \*